(12) United States Patent
Koya

(10) Patent No.: US 6,329,604 B1
(45) Date of Patent: Dec. 11, 2001

(54) MULTILAYER PRINTED CIRCUIT BOARD

(75) Inventor: Kenji Koya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/635,175

(22) Filed: Aug. 9, 2000

(30) Foreign Application Priority Data

Aug. 10, 1999 (JP) ................................................. 11-226986

(51) Int. Cl.7 .................................................... H05K 1/03
(52) U.S. Cl. .......................... 174/255; 174/258; 174/261; 174/262; 174/266; 361/792; 361/794; 361/795; 361/818
(58) Field of Search ..................................... 174/255, 261, 174/262, 266, 258, 260; 361/780, 792, 793, 794, 795, 818, 760, 777, 784; 257/698, 702, 637

(56) References Cited

U.S. PATENT DOCUMENTS

| | | | | |
|---|---|---|---|---|
| 4,047,132 | * | 9/1977 | Krajewski ............................ | 333/238 |
| 4,313,026 | * | 1/1982 | Yamada et al. ...................... | 174/256 |
| 4,814,945 | * | 3/1989 | Leibowitz ............................ | 361/792 |
| 4,916,259 | * | 4/1990 | Charsky et al. ...................... | 174/256 |
| 5,191,174 | * | 3/1993 | Chang et al. ........................ | 174/266 |
| 5,315,069 | * | 5/1994 | Gebara ................................. | 174/250 |
| 5,714,718 | * | 2/1998 | Tanaka ................................. | 174/255 |
| 5,838,549 | * | 11/1998 | Nagata et al. ....................... | 361/794 |
| 5,856,636 | * | 1/1999 | Sanso .................................. | 174/255 |
| 6,040,985 | * | 3/2000 | Arai et al. ............................ | 361/780 |
| 6,103,977 | * | 8/2000 | Namgung ............................ | 174/255 |
| 6,184,477 | * | 2/2001 | Tanahashi ............................ | 174/261 |
| 6,191,475 | * | 2/2001 | Skinner et al. ...................... | 257/700 |

FOREIGN PATENT DOCUMENTS

| | | |
|---|---|---|
| 63-4695 | 1/1988 | (JP) . |
| 7-273468 | 10/1995 | (JP) . |
| 08153975 | * 6/1996 | (JP) . |

* cited by examiner

Primary Examiner—Jeffrey Gaffin
Assistant Examiner—J B Patel
(74) Attorney, Agent, or Firm—Sughrue, Mion, Zinn, Macpeak & Seas, PLLC

(57) ABSTRACT

A multilayer printed wiring board prevents unnecessary emission of electromagnetic waves. The board includes at least two signal wiring layers, at least one ground layer, at least one power source layer, and a ground plane. The board further includes ground wiring adjacent to signal wiring in a signal wiring layer farther apart from said ground layer, the ground wiring being in the signal wiring layer. The ground wiring serves as a return current path for a signal current flowing in the signal wiring. In this structure, the return current path is reserved adjacent to the signal current path and the signal wiring is lower in impedance than the ground plane. The current can be fed back through a shorter closed loop. It is therefore possible to form a small loop to pass a signal current returning to a ground point and flowing through each signal wiring arranged in the board and a return current of the signal current. This minimizes unnecessary emission of electromagnetic waves. It is also possible to form a small loop to pass a signal current returning to a ground point and flowing through each signal wiring in at least two different layers connected via a through-hole to each other and a return current of the signal current.

8 Claims, 8 Drawing Sheets

F I G. 11
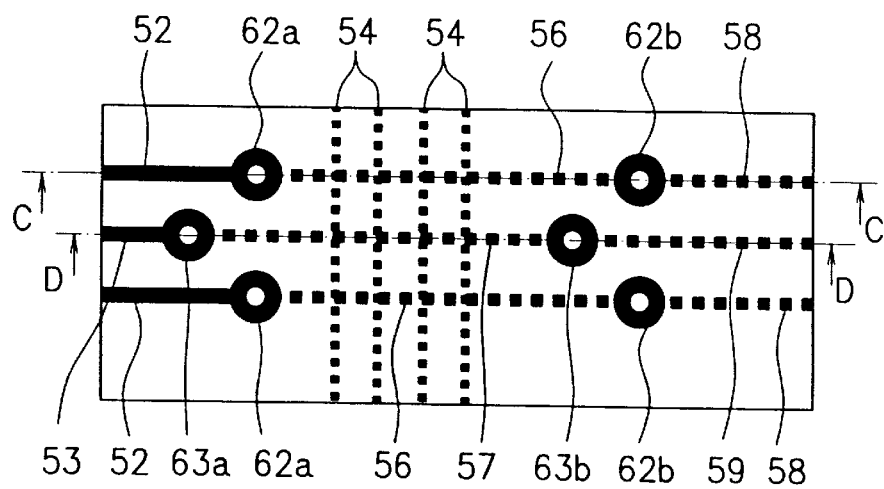
F I G. 12
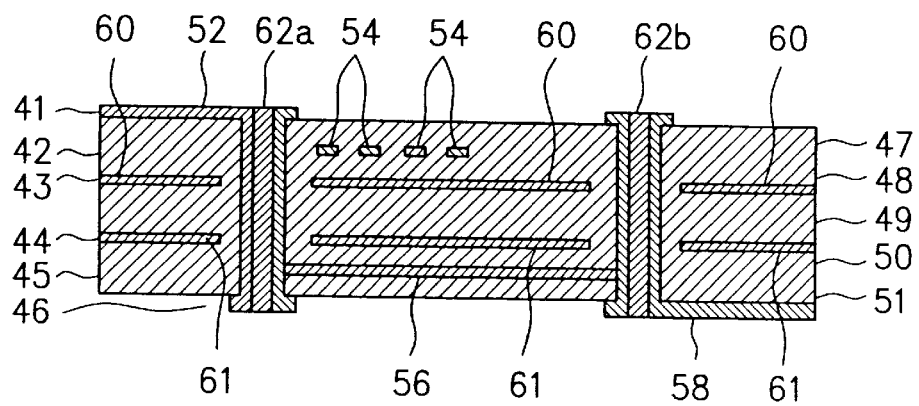
F I G. 13
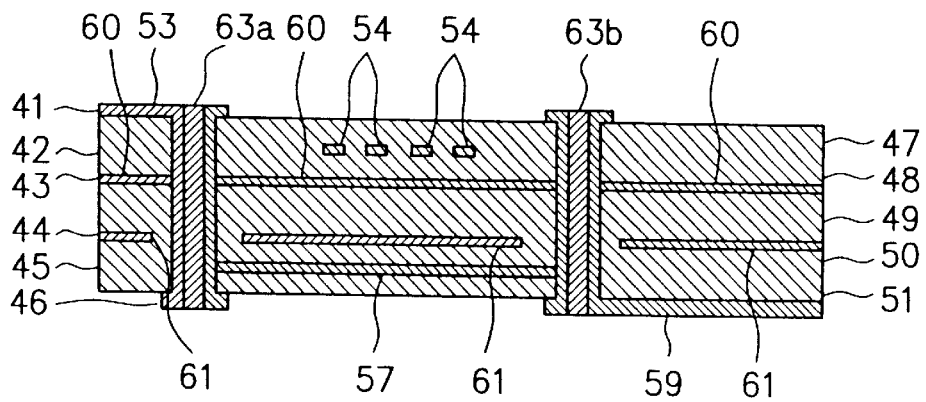

1

MULTILAYER PRINTED CIRCUIT BOARD

BACKGROUND OF THE INVENTION

The present invention relates to a multilayer printed circuit board, and in particular, to a multilayer printed circuit board including, for example, four layers, six layers, or the like.

DESCRIPTION OF THE PRIOR ART

Heretofore, a multilayer printed circuit board includes in general a power source plane. FIGS. 1 to 3 show, in cross-sectional views, configurations of multilayer printed circuit boards of the prior art.

FIG. 1 shows a cross section of constitution a four-layer printed circuit board as a prior art example 1. Example 1 includes, beginning at an upper-most layer of board, a first signal wiring layer 111, a ground layer 112, a power source layer 113, and a second signal wiring layer 114. Disposed between layers 111 to 114 are an inter-layer insulating layers 115 to 117, respectively.

In prior art example 1 of FIG. 1, a signal wiring 118 is formed in first signal wiring layer 111, signal wiring 119 is arranged in second signal wiring layer 114, a planar ground plane 120 is fabricated in ground layer 112, and a planar power source plane 121 is disposed in power source layer 113.

When a signal current, which returns to a ground point, flows in signal wiring 118, a return current is induced in ground plane 120 of ground layer 112 adjacent via inter-layer insulator 115 to signal wiring 118 to form a small loop including signal wiring 118 and ground plane 120. The loop emits weak electromagnetic waves unnecessary for operation.

FIG. 2 shows in a cross-sectional view a configuration example of a six-layer printed circuit board as a prior art example 2. The board of prior art example 2 includes, beginning at an upper-most layer, a first signal wiring layer 131, a second signal wiring layer 132, a ground layer 133, a power source layer 134, a third signal wiring layer 135, and a fourth signal wiring layer 136. Fabricated between layers 131 to 136 are inter-layer insulating layers 137 to 141, respectively.

In prior art example 2 shown in FIG. 2, signal wiring 142 is arranged in first signal wiring layer 131, signal wiring 143 is formed in second signal wiring layer 132, signal wiring 144 is manufactured in third signal wiring layer 135, signal wiring 145 is formed in fourth signal wiring layer 136, a planar ground plane 146 is formed in ground layer 133, and a planar power source plane 147 is disposed in power source layer 134. When a signal current returning to a ground point flows through signal wiring 143, a return current is induced in ground plane 146 of ground layer 133 adjacent via inter-layer insulator 138 to signal wiring 143 to form a small loop including signal wiring 143 and ground plane 146. The loop radiates weak, unnecessary electromagnetic waves.

FIG. 3 shows a cross section of a configuration example of a six-layer printed circuit board as a prior art example 3. Prior art example 3 includes, beginning at an upper-most layer, a first signal wiring layer 151, a ground layer 152, a second signal wiring layer 153, a third signal wiring layer 154, a power source layer 155, and a fourth signal wiring layer 156. Disposed respectively between layers 151 to 156 are interlayer insulating layers 157 to 161.

In the circuit board of prior art example 3 shown in FIG. 3, signal wiring 162 is arranged in first signal wiring layer 151, signal wiring 163 is formed in second signal wiring layer 153, signal wiring 164 is manufactured in third signal wiring layer 154, signal wiring 165 is formed in fourth signal wiring layer 156, a planar ground plane 166 is formed in ground layer 152, and power source plane 167 is disposed in power source layer 155. When a signal current returning to a ground point flows through signal wiring 162 and/or signal wiring 163, a return current is induced in ground plane 166 of ground layer 152 adjacent via inter-layer insulator 157 or 158 to signal wiring 162 or 163 to form a small loop including signal wiring 162 and/or signal wiring 163 and ground plane 166. The loop emits weak electromagnetic waves unnecessary for operation.

Japanese laid-Open Patent Application. No. Showa 63-004695 (4695/1988) entitled "multi-layer printed circuit board" describes a fourth prior art example analogous to the prior art of the present invention. Prior art example 4 includes a substrate on which heat radiator fins are disposed to efficiently radiate heat to reduce noise.

A fifth prior art example is a "multi-layer printed circuit board" described in Japanese laid-Open Patent Application. No. Heisei 7-273468 (273468/1995). This circuit board includes a signal wiring layer and a power source layer as inside layers. A conductor pattern is fabricated in the signal wiring layer or the power source layer to substantially extend an area of a ground pattern. This stabilizes ground potential of the board to minimize noise caused by emission of electromagnetic waves.

However, in the four-layer printed circuit board of prior art example 1 shown in FIG. 1, when a signal current returning to a ground point flows in signal wiring 119, no return current is induced in power source plane 121 of power source layer 113 adjacent via an inter-layer insulator 117 to signal wiring 119. Namely, a return current is induced at a faraway ground point. As a result, there is formed a large loop with signal wiring 119 and the faraway ground point at which the return current is induced. Therefore, strong, unnecessary electromagnetic waves are emitted from the loop. When signal wiring 111 is connected via through-hole 122 to signal wiring 114, a return current is similarly induced at a faraway ground position to form a large loop including through-hole 122, signal wiring 114, and the faraway ground point. This leads to a problem of strong, unnecessary electromagnetic waves emitted from the loop.

In the six-layer printed circuit board of prior art example 2 of FIG. 2, when a signal current returning to a ground point flows through signal wiring 142, 144, and/or 145, there is induced no return current in signal wiring 142 of signal wiring layer 132, power source plane 147 of power source layer 134, or signal wiring 145 of signal wiring layer 132 adjacent respectively to inter-layer insulator films 137, 140, or 141. A return current is induced at a faraway ground point. Consequently, a large loop is configured by signal wiring 142, 144, or 145 and the faraway ground point at which the return current is induced. In consequence, unnecessary electromagnetic waves radiated from the loop become stronger. When at least two or more signal wiring selected from wiring 142 to 145 are connected to each other by through-hole 148, a return current is induced at a faraway ground point. There is formed a large loop including the signal wiring thus connected to each other, through-hole 148, and the faraway ground point. This leads to a problem that the loop emits strong electromagnetic waves not required.

In the six-layer printed circuit board of prior art example 3 shown in FIG. 3, when a signal current returning to a ground point flows through signal wiring 164 and/or 165, no return current is induced in power source plane 167 of power source layer 155 adjacent via inter-layer insulator 160 or 161 to the signal wiring. A return current is induced to a faraway ground point. This results in a large loop including signal wiring 164 or 165 and the faraway ground point. The loop emits strong unnecessary electromagnetic waves. When at least one of signal wiring 164 and 165 is connected to another signal wiring in a different signal wiring layer via through-hole 168, a return current is similarly induced at a faraway ground point. This forms a large loop including at least one of signal wiring 164 and 165, through-hole 168, and the faraway ground point. There arises a problem of strong, unnecessary electromagnetic waves emitted from the loop.

SUMMARY OF THE INVENTION

It is therefore an object of the present invention, which has been devised to remove the drawback of the prior art, to provide a multilayer printed circuit board capable of suppressing the electromagnetic waves not required.

To achieve the object above in accordance with a first aspect of the present invention, there is provided a multilayer printed circuit board comprising at least two signal wiring layers (1, 4), at least one ground layer (2), at least one power source layer (3), and ground wiring (10) adjacent to signal wiring (9) in at least one signal wiring layer (4) farther apart from said ground layer (2), the ground wiring (10) being in said signal wiring (9), said ground wiring (10) serving as a return current path for a signal current flowing in said signal wiring (9).

In accordance with a second aspect of the present invention, the multilayer printed circuit board desirably further includes a signal through-hole (14) connecting signal wiring (8, 9) in at least two signal wiring layers (1, 4) to each other.

In accordance with a third aspect of the present invention, the multilayer printed circuit board desirably further includes a ground plane (12) fabricated in said at least one ground layer (2) and a ground through-hole (15) for connecting said ground plane (12) to said ground wiring (10).

In accordance with a fourth aspect of the present invention, in the multilayer printed circuit board 3, said ground through-hole (15) is favorably adjacent to said signal through-hole (14).

In accordance with a fifth aspect of the present invention, in the multilayer printed circuit board, one or two said ground wiring (10) is desirably fabricated between two said signal wiring and said ground wiring is desirably adjacent to said signal wiring in any situation.

In accordance with a sixth aspect of the present invention, in the multilayer printed circuit board, said signal wiring is lower in impedance than said ground plane (12) and the current can be fed back through a shorter closed loop.

BRIEF DESCRIPTION OF THE DRAWINGS

The objects and features of the present invention will become more apparent from the consideration of the following detailed description taken in conjunction with the accompanying drawings in which:

FIG. 11 is a plan view showing an example of structure of the second embodiment;

FIG. 12 is a cross-sectional view taken along line C—C of the second embodiment shown in FIG. 11;

FIG. 13 is a cross-sectional view taken along line D—D of the second embodiment of FIG. 11;

DESCRIPTION OF THE PREFERRED EMBODIMENTS

Referring next to the drawings, description will be given in detail of an embodiment of a multi-layer printed circuit board in accordance with the present invention. FIGS. 4 to 16 shows embodiments of a multilayer printed circuit board in accordance with the present invention.

First Embodiment

Figure 1:
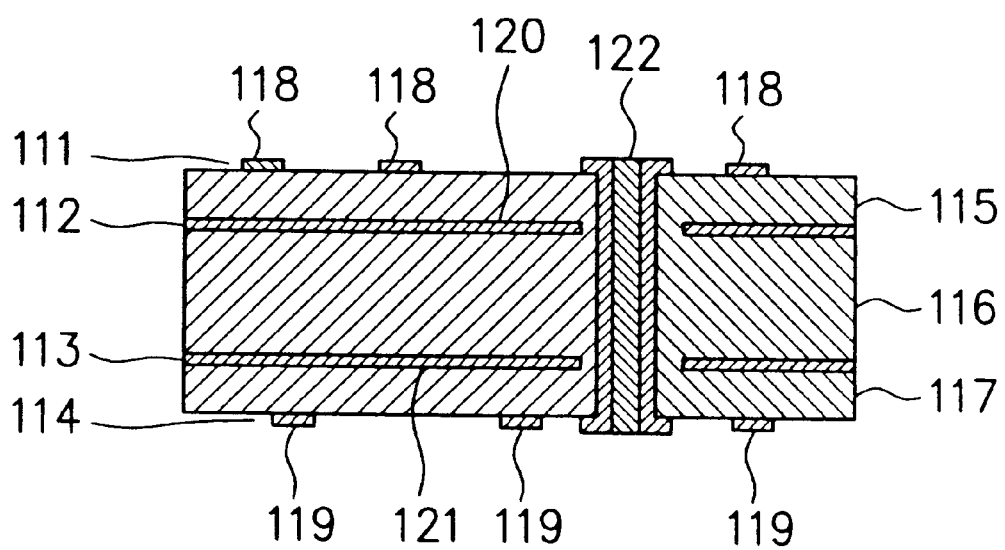
FIG. 1 is a cross-sectional view showing a configuration example of a four-layer printed circuit board as a prior art example 1.
Figure 2:
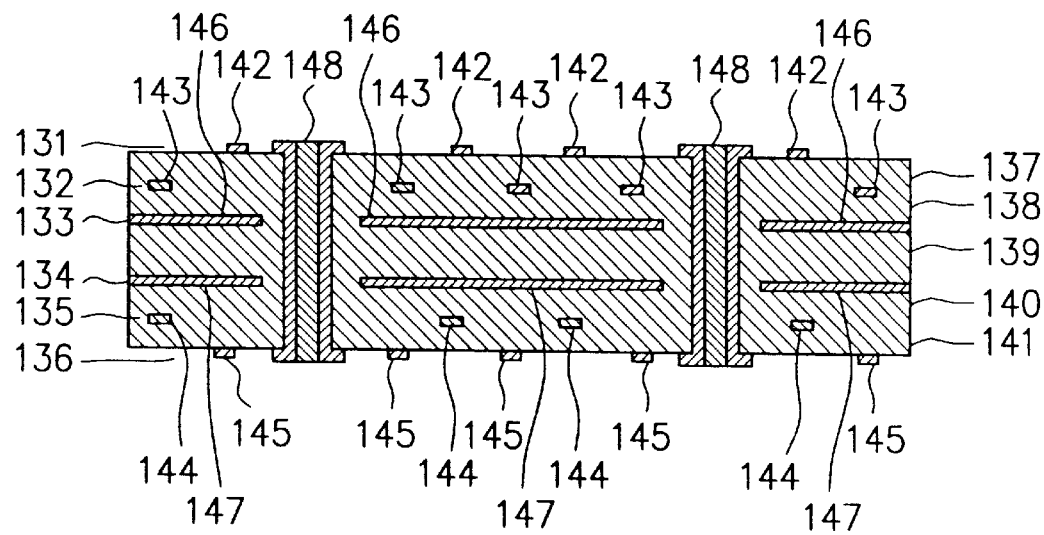
FIG. 2 is a cross-sectional view showing an example of constitution of a six-layer printed circuit board as a prior art example 2.
Figure 3:
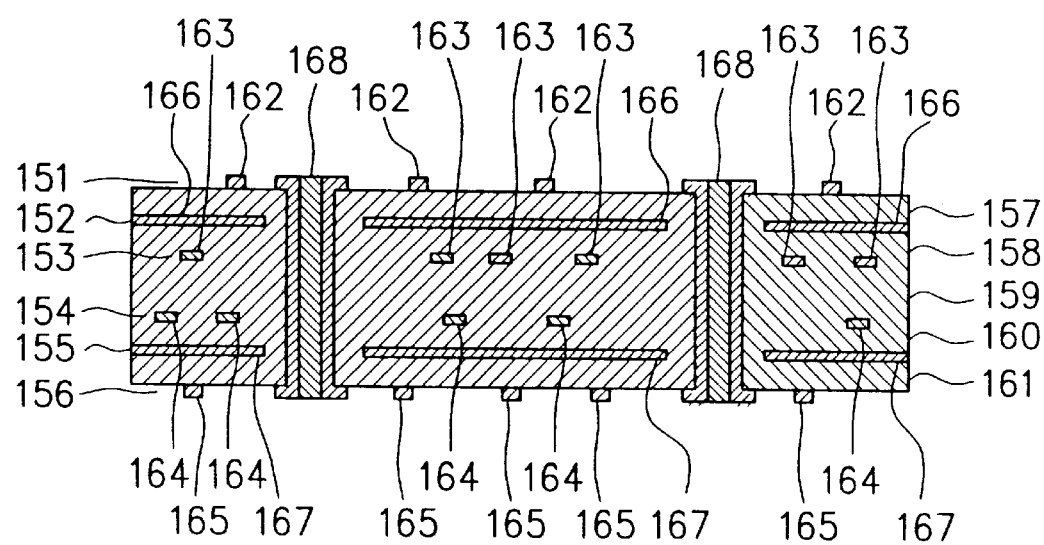
FIG. 3 is a cross-sectional view showing a structure example of a six-layer printed circuit board as a prior art example 3.
Figure 4:
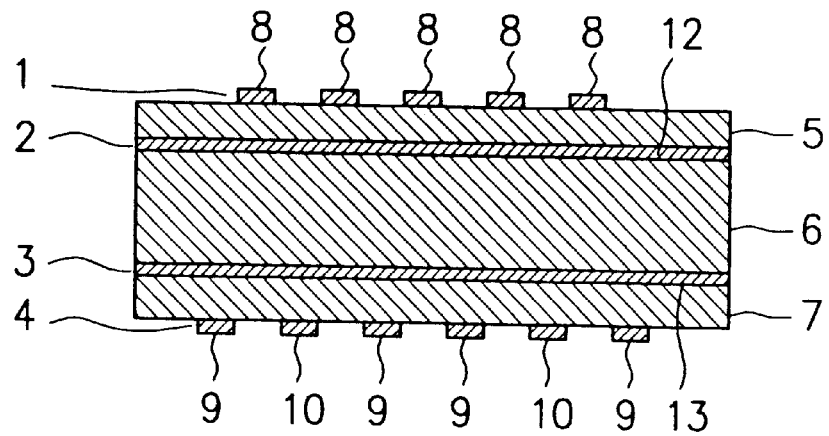
FIG. 4 is a cross-sectional view showing a first embodiment of a four-layer printed circuit board in accordance with the present invention.

FIG. 4 shows, in a cross-sectional view, a constitution example of a first embodiment of a four-layer printed circuit board in accordance with the present invention. The circuit board of the first embodiment shown in FIG. 4 includes, beginning at an upper-most layer, a first signal wiring layer 1, a ground layer 2, a power source layer 3, and a second signal wiring layer 4. Between layers 1 to 4, there are respectively fabricated inter-layer insulating films 5 to 7.

In first signal wiring layer 1, signal wiring 8 is disposed; in second signal wiring layer 4, signal wiring 9 is fabricated; in ground layer 2, a planar ground plane 12 is arranged, and in power source layer 3, a planar power source plane 13 is manufactured.

Figure 5:
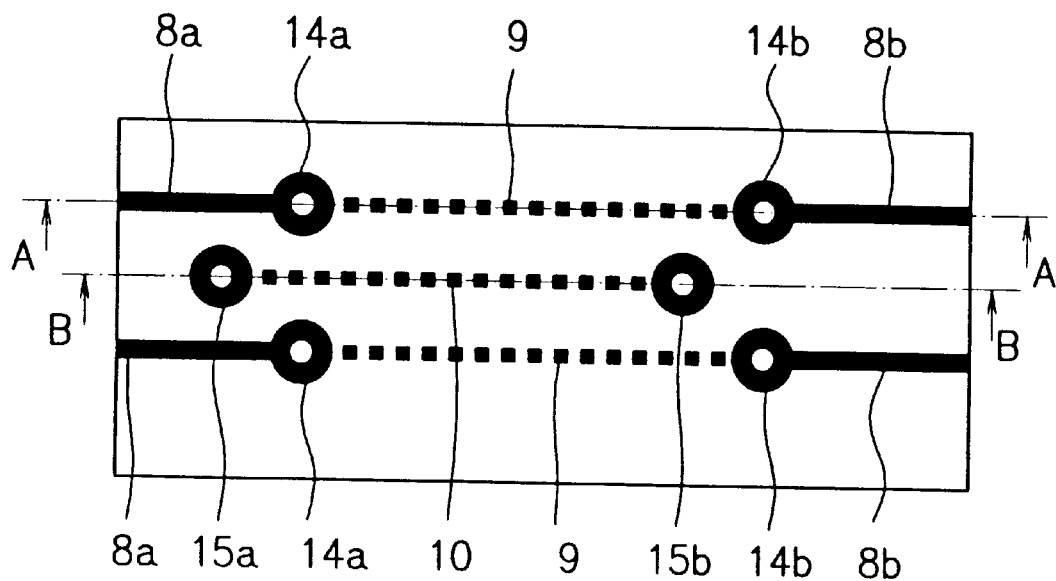
FIG. 5 is a plan view showing an example of constitution of the first embodiment.
Figure 6:
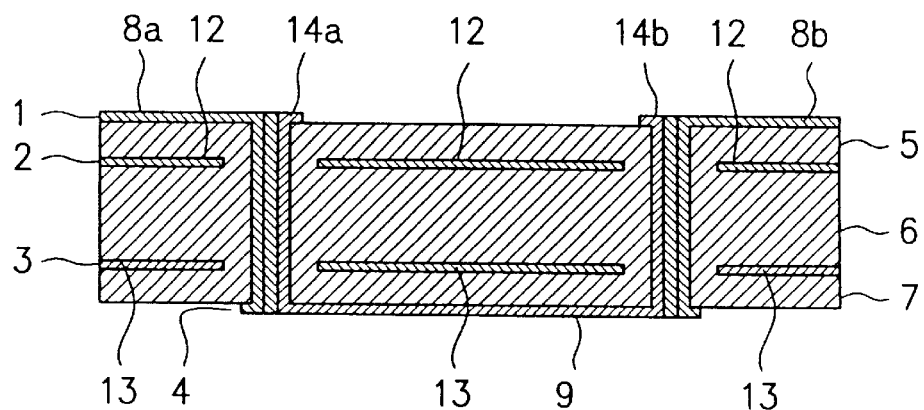
FIG. 6 is a cross-sectional view taken along line A—A of the first embodiment shown in FIG. 5.
Figure 7:
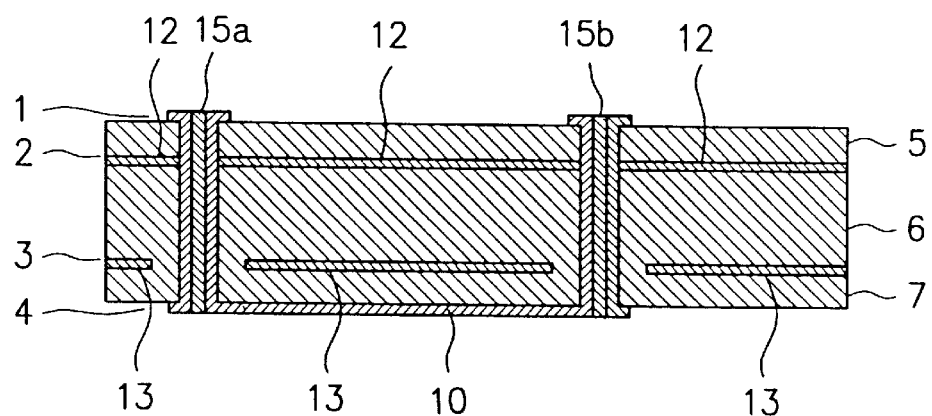
FIG. 7 is a cross-sectional view taken along line B—B of the first embodiment of FIG. 5.

FIG. 5 shows, in a plan view, an example of constitution of the first embodiment. FIG. 6 shows a cross-section along line A—A of the first embodiment of FIG. 5. FIG. 7 shows a cross section along line B—B of the first embodiment. The four-layer printed circuit board of the first embodiment shown in FIGS. 5 to 7 includes, beginning at an upper-most layer, a first signal wiring layer 1, a ground layer 2, a power source layer 3, and a second signal wiring layer 4. Respectively arranged between layers 1 to 4 are inter-layer insulating films 5 to 7.

In first signal wiring layer 1, signal wiring 8a and signal wiring 8b are fabricated; in second signal wiring layer 4, there are formed signal wiring 9 and ground wiring 10 adjacent thereto; in ground layer 2, a planar ground plane 12 is arranged; and in power source layer 3, a planar power source plane 13 is disposed.

In first signal wiring layer 1, signal wiring 8a is connected to signal through-hole 14a, which is linked with signal wiring 9 in second signal wiring layer 4. Signal wiring 9 is coupled with signal through-hole 14b, which is connected to signal wiring 8b in signal wiring layer 1. This configuration thereby provides a continuous signal current path. Ground wiring 10 is linked with ground through-holes 15a and 15b arranged in the proximity of signal through-holes 14a and 14b and connected to ground plane 12 of ground layer 2.

Figure 8:
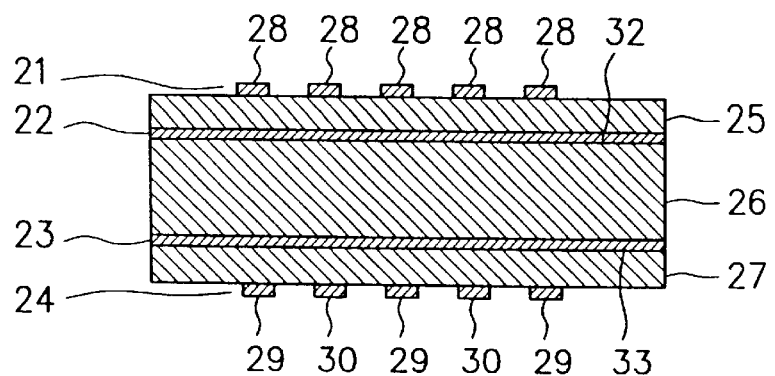
FIG. 8 is a cross-sectional view showing a variation of the first embodiment in accordance with the present invention.

FIG. 8 shows in a cross-sectional view a variation of the first embodiment of the four-layer printed circuit board. Compared with FIG. 4 including one ground wiring 10 for every two signal wiring 9, FIG. 8 includes one ground wiring 30 for each signal wiring 29. It is only necessary that the ground wiring is arranged for the signal wiring without any wiring therebetween.

<<Operation>>

Description will now be given of an example of operation conducted by the first embodiment of the four-layer printed circuit board. When a signal current returning to a ground point flows through signal wiring 8 of first signal wiring layer 1, a return current is induced in ground plane 12 of ground layer 2 adjacent to signal wiring 8 via insulator 5. There is formed a small loop including signal wiring 8 through which the signal current flows and ground plane 12 in which the return current is induced. This minimizes unnecessary electromagnetic waves emitted from the loop.

When a signal current returning to a ground point flows in signal wiring 9 of second signal wiring layer 4, no return current is induced in power source plane 13 of power source layer 3 adjacent via insulator 7 to signal wiring 9. A return current is induced in ground wiring 10 fabricated also in second signal wiring layer 4 adjacent to signal wiring 9. There is formed a loop including signal wiring 9 in which the signal current flows and ground wiring 10 in which the return current is induced. The loop is smaller than that formed when ground wiring 10 is not disposed adjacent to second wiring layer 4. Therefore, unnecessary electromagnetic waves emitted from the loop are reduced.

Description will now be given of an example of operation carried out by the four-layer printed circuit board shown in FIGS. 5 to 7. When a signal current flows in a continuous signal current path in a plurality of layers, i.e., from signal wiring 8a of first signal wiring layer 1 via signal wiring 9 of second signal wiring layer 4 to signal wiring 8b of first signal wiring layer 1, a return current is induced in ground plane 12 for signal wiring 8a, in ground through-hole 15a for signal through-hole 14a, in ground through-hole 15b for signal through-hole 14b, and in ground plane 12 for signal wiring 8b. There is formed a continuous return current path including ground plane 12, ground through-hole 15a, ground wiring 10, ground through-hole 15b, and ground plane 12, and hence a return current flows through this path.

The continuous signal current path to pass the signal current and the continuous return current path to pass the return current constitute a loop. This loop is smaller than that formed when ground wiring 10 and/or ground through-holes 15a and 15b are absent, and hence unnecessary electromagnetic waves emitted from the loop is minimized.

In FIG. 4, for a signal current returning to a ground point and flowing through signal wiring 8 of first signal wiring layer 1, a return current flows in ground plane of ground layer 2 adjacent via insulator 5 to signal wiring 8. However, no return current flows in power source plane 13 of power source layer 3 adjacent via insulator 7 to second signal wiring layer 4. By arranging ground wiring 10 in the signal wiring layer of signal wiring 9 to be adjacent to signal wiring 9, a return current path is reserved in ground wiring 10 for the signal current returning to a ground point and flowing in signal wiring 9. There is formed a small loop including signal wiring 9 and ground wiring 10 to advantageously reduce unnecessary emission of electromagnetic waves from the loop.

In FIGS. 5 to 7, signal wiring 8a of first signal wiring layer 1 is coupled with signal wiring 9 of second signal wiring layer 4. Signal wiring 9 is further connected via signal through-hole 14b to signal wiring 8b of first signal wiring layer 1. This layer configuration configures a signal current path returning to a ground point. Through-holes 15a and 15b are arranged in the vicinity of signal through-holes 1a and 14b to be connected to ground plane 12 of ground layer 2, and through-holes 15a and 15b are linked with ground wiring 10 adjacent to signal wiring 9. For a continuous signal current path returning to a ground potential which includes signal wiring 8a, signal through-holes 14a, signal wiring 9, signal through-hole 14b, and signal wiring 8b, the configuration above resultantly forms a continuous return current path adjacent thereto including ground plane 12, ground through-hole 15a, ground wiring 10, ground through-hole 15b, and ground plane 12. The continuous signal current path and the return current path adjacent thereto constitute a small loop. Therefore, unnecessary emission of electromagnetic waves is minimized.

Second Embodiment

Referring to the drawings, description will be given in detail of a second embodiment in accordance with the present invention.

Figure 9:
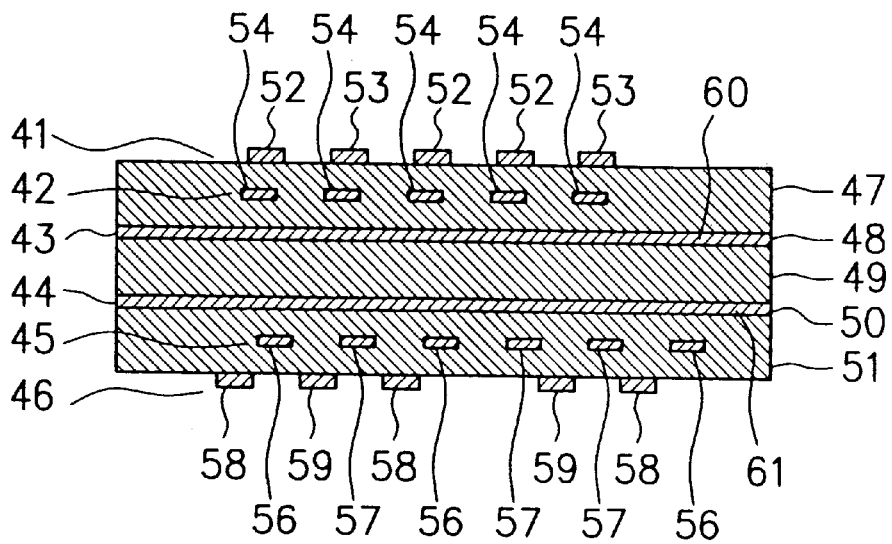
FIG. 9 is a cross-sectional view showing a layout example a second embodiment of a six-layer printed circuit board in accordance with the present invention.

FIG. 9 shows in a cross-sectional view of a second embodiment of a six-layer printed circuit board in accordance with the present invention. The second embodiment of FIG. 9 includes, beginning at an upper-most layer, a first signal wiring layer 41, a second signal wiring layer 42, a ground layer 43, a power source layer 44, a third signal wiring layer 45, and a fourth signal wiring layer 46. Fabricated respectively between layers 41 to 46 are inter-layer isolating films 47 to 51. In first signal wiring layer 41, signal wiring 52 and ground wiring 53 are disposed; in second signal wiring layer 42, signal wiring 54 is manufactured; in third signal wiring layer 45, signal wiring 56 and ground wiring 57 are arranged; in fourth signal wiring layer 46, signal wiring 58 and ground wiring 59 are disposed; in ground layer 43, a planar ground plane 60 is fabricated; and in power source layer 44, a planar power source plane 61 is arranged.

Ground layer 43 is adjacent to second signal wiring layer 42. Ground plane 60 serves as a return current path for a signal current flowing in signal wiring 54 and returning to a ground point. Ground wiring 53 is adjacent to signal wiring 52 of first signal wiring layer 41 and serves as a return current path for a signal current in signal wiring 52. Similarly, ground wiring 57 is formed adjacent to signal wiring 56 of third signal wiring layer 45 and is used as a return current path for a signal current flowing in signal wiring 56. Ground wiring 59 is disposed adjacent to signal wiring 58 of fourth signal wiring layer 46 to serve as a return current path for a signal current in signal wiring 58. These signal current paths and the associated return current paths form a loop. The loop is smaller than that configured when ground wiring 53, 57, and 59 are absent. This consequently reduces unnecessary emission of electromagnetic waves from the loops.

FIG. 11 shows in a plan view a configuration of the six-layer printed circuit board of FIG. 9.

FIG. 12 is a cross-sectional view of the circuit board along line C—C of FIG. 11;

FIG. 13 is a cross-sectional view of the circuit board along line D—D of FIG. 11.

The circuit board of FIGS. 11 to 13 includes, beginning at an upper-most layer, a first signal wiring layer 41, a second signal wiring layer 42, a ground layer 43, a power source layer 44, a third signal wiring layer 45, and a fourth signal wiring layer 46. Fabricated between layers 41 to 46 are inter-layer insulating films 47 to 51, respectively. In first signal wiring layer 41, there are manufactured signal wiring 52 and ground wiring 53 adjacent thereto. In second signal wiring layer 42, signal wiring 54 is arranged. In third signal wiring layer 45, there are disposed signal wiring 56 and ground wiring 57 adjacent thereto. Fabricated in fourth signal wiring layer 46 are signal wiring 58 and ground wiring 59 adjacent thereto. The circuit board further includes a signal through-hole 62a connected to signal wiring 52 and 56, a signal through-hole 62b coupled with signal wiring 56 and 58, a ground through-hole 63a which is adjacent to signal through-hole 62a and which is linked with ground wiring 53 and 57 and ground plane 60, and a ground hole 63b which is adjacent to signal through-hole 62b and which is connected to ground wiring 57 and 59 and ground plane 60.

When a signal current returning to a ground potential flows through signal wiring 52, signal through-hole 62a, signal wiring 56, signal through-hole 62b, and signal wiring 58, a return current is induced in ground wiring 53 for signal wiring 52, in ground through-hole 63a for signal through-hole 62a, in ground wiring 57 for signal wiring 56, in ground through-hole 63b for signal through-hole 62b, and in ground wiring 59 for signal wiring 58. This reserves a continuous return current path. The continuous signal current path and the continuous return current path corresponding thereto form a small loop, and hence unnecessary emission of electromagnetic waves is suppressed.

Figure 10:
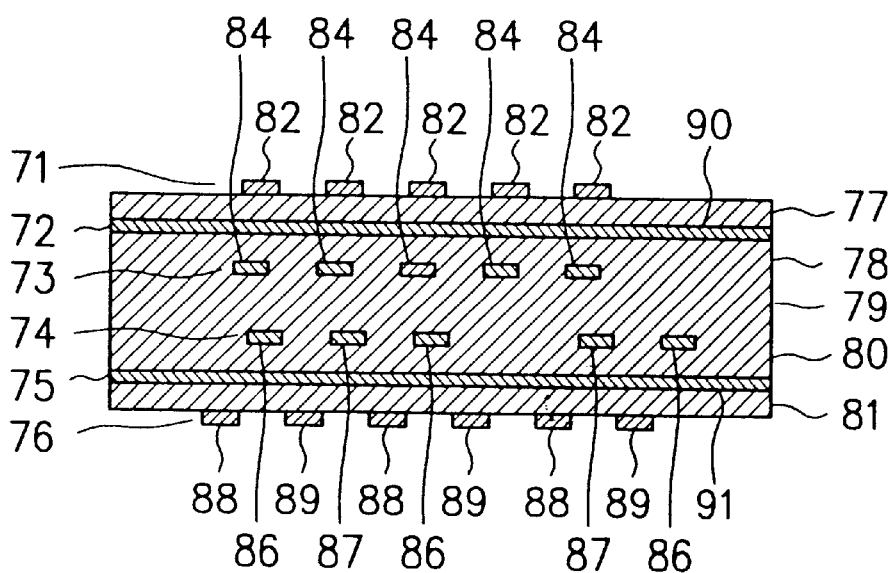
FIG. 10 is a cross-sectional view showing a variation of the second embodiment in accordance with the present invention.

FIG. 10 shows in a cross-sectional view a variation of the second embodiment of a six-layer printed circuit board. The circuit board of FIG. 10 includes, beginning at an upper-most layer, a first signal wiring layer 71, a ground layer 72, a second signal wiring layer 73, a third signal wiring layer 74, a power source layer 75, and a fourth signal wiring layer 76. Manufactured between layers 71 to 76 are inter-layer insulating films 77 to 81, respectively. In first and second signal wiring layers 71 and 73, signal wiring 82 and signal wiring 84 are respectively arranged. In third signal wiring layer 74, there are formed signal wiring 86 and ground wiring 87 adjacent thereto. In fourth signal wiring layer 76, there are formed signal wiring 88 and ground wiring 89 adjacent thereto. In ground layer 72, a planar ground plane 90 is fabricated. In power source layer 75, a planar power source plane 91 is disposed.

First ground layer 72 is adjacent to first and second signal wiring layers 71 and 73 respectively via insulating films 77 and 78. Ground plane 90 serves as a return current path for a signal current which flows in signal wiring 82 and 84 and which returns to a ground point. Ground wiring 87 is used as a return current path for a signal current flowing in signal wiring 86 and returning to a ground point. Ground wiring 89 serves as a return current path for a signal current flowing in signal wiring 88 and returning to a ground point. There is formed a loop including signal wiring of a signal wiring layer which is not adjacent to ground layer 72 and in which a signal current returning to a ground point flows and ground wiring of a return current path associated with the signal wiring. The loop is smaller than that formed when ground wiring 87 and/or ground wiring 89 are/is absent. This consequently prevents unnecessary emission of electromagnetic waves.

Figure 14:
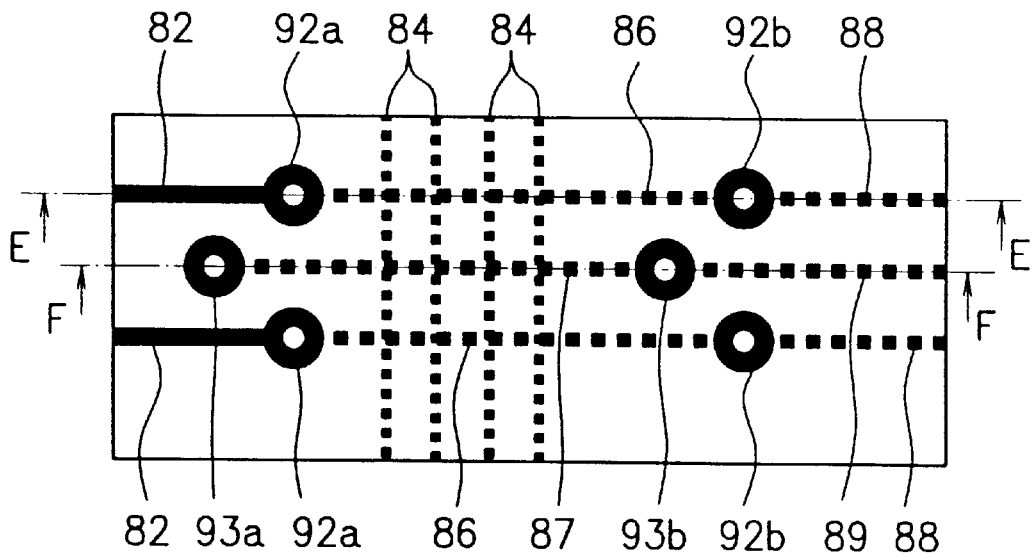
FIG. 14 is a plan view showing a configuration example of the variation shown in FIG. 14.

FIG. 14 is a plan view showing structure of the six-layer printed circuit board of FIG. 14.

Figure 15:
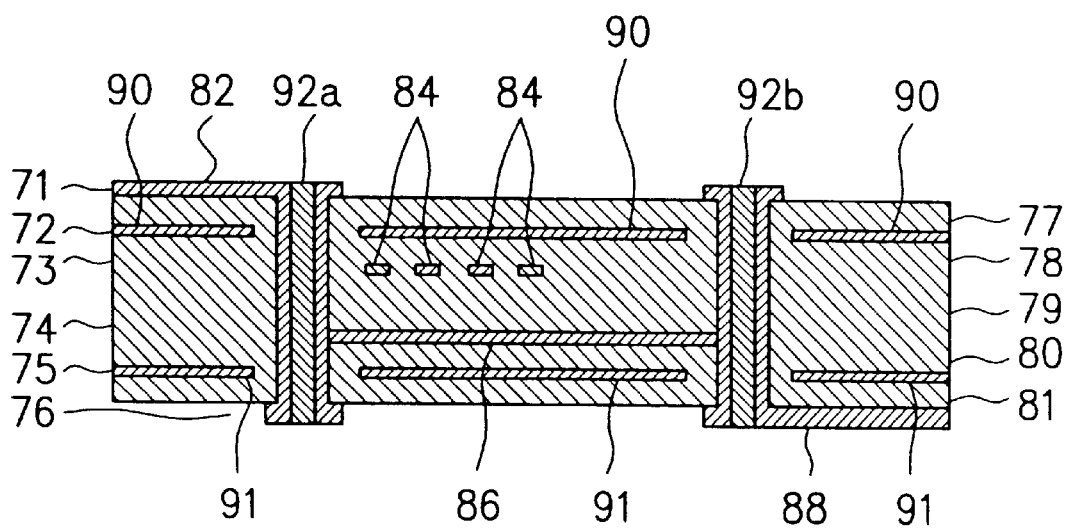
FIG. 15 is a cross-sectional view taken along line E—E of the variation shown in FIG. 14.
Figure 16:
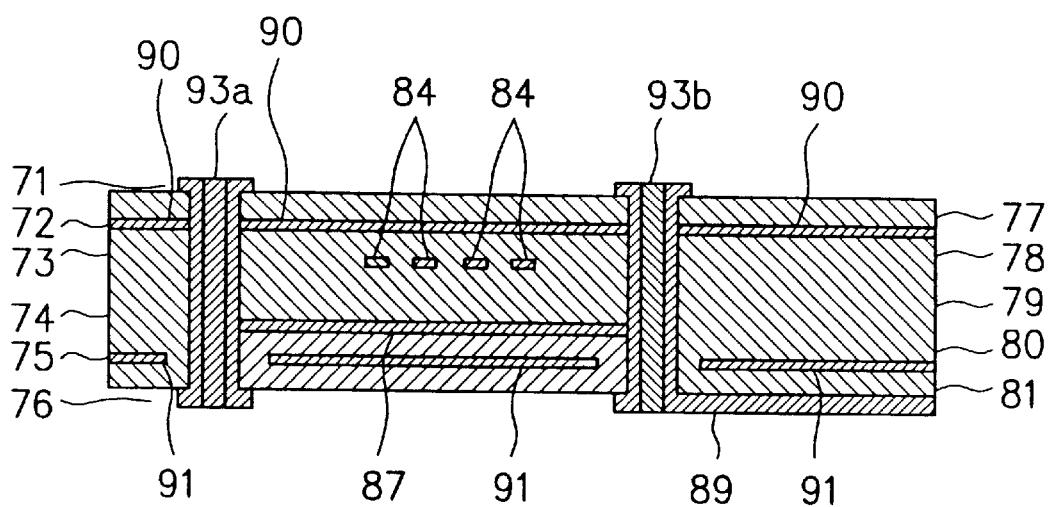
FIG. 16 is a cross-sectional view taken along line F—F of the variation of FIG. 14.

FIG. 15 is a cross-sectional view showing the circuit board along line E—E of FIG. 14;

FIG. 16 shows in a cross-sectional view a configuration of the circuit board along line F—F of FIG. 14.

The circuit board of FIGS. 14 to 16 includes, beginning at an upper-most layer, a first signal wiring layer 71, a ground layer 72, a second signal wiring layer 73, a third signal wiring layer 74, a power source layer 75, and a fourth signal wiring layer 76. Inter-layer insulating films 77 to 81 are formed between layers 71 to 76, respectively. In first and second signal wiring layers 71 and 73, signal wiring 82 and signal wiring 84 are respectively manufactured. In third signal wiring layer 74, there are formed signal wiring 86 and ground wiring 87 adjacent thereto. In fourth signal wiring layer 76, there are disposed signal wiring 88 and ground wiring 89 adjacent thereto.

The circuit board further includes a signal through-hole 92a connected to signal wiring 82 and 86, a signal through-hole 92b linked with signal wiring 86 and 88, a ground through-hole 93a which is adjacent to signal through-hole 92a and which is coupled with ground wiring 87 and ground plane 90, and a ground hole 93b which is adjacent to signal through-hole 92b and which is connected to ground wiring 87 and 89 and ground plane 90.

When a signal current returning to a ground potential flows through signal through-hole 92a, signal wiring 86, signal through-hole 92b, and signal wiring 88, a return current is induced in ground plane 90 for signal wiring 82, in ground through-hole 93a for signal through-hole 92a, in ground wiring 87 for signal wiring 86, in ground through-hole 93b for signal through-hole 92b, and in ground wiring 89 for signal wiring 88. As a result, a continuous return current path is reserved. The continuous signal current path and the continuous return current path associated therewith constitute a small loop. This advantageously minimizes unnecessary emission of electromagnetic waves.

In the embodiment of the multilayer printed circuit board, ground wiring is arranged adjacent to signal wiring in a signal wiring layer not adjacent to a ground layer and/or a ground through-hole is fabricated adjacent to a signal through-hole and/or a return current path of a current flowing in a signal through-hole is prepared in ground wiring and/or in a ground through-hole. This configuration advantageously minimizes unnecessary emission of electromagnetic waves.

In accordance with the respective embodiments above, a return current path for a signal current returning to a ground point is disposed in ground wiring adjacent to signal wiring in a signal wiring layer farther apart from a ground layer. Moreover or alternative, a ground through-hole is manufactured adjacent to a signal through-hole connecting signal wiring of different signal wiring layers to each other. The ground through-hole is connected to ground wiring arranged adjacent to signal wiring in a signal wiring layer farther apart from a ground layer. This resultantly reserves a return current path adjacent to the signal current path, and the signal wiring is fabricated to have low impedance compared with the ground plane. Consequently, the current feedback can be achieved through a shorter loop.

The embodiments above are suitable examples of the present invention. However, the present invention is not restricted by the embodiments. The embodiments can be changed and modified within the scope and the spirit of the present invention.

As can be seen from the description above, the multilayer printed circuit board in accordance with the present invention includes a ground layer, a ground plane, signal wiring in at least one signal wiring layer farther apart from the ground layer, and ground wiring in the signal wiring layer, the ground wiring being adjacent to the signal wiring. The ground wiring serves as a return current path for a signal current flowing through the signal wiring. The return current path is therefore reserved adjacent to the signal current path and the signal wiring has low impedance when compared with the ground plane. Therefore, the current feedback can be conducted through a shorter loop.

The multilayer printed circuit board provides a first advantage as follows. There is formed a small loop to pass a signal current returning to a ground point and flowing through each signal line disposed in the printed circuit board and a return current of the signal current. It is therefore possible to suppress unnecessary emission of electromagnetic waves.

The multilayer printed circuit board provides a second advantage of possibility to form a small loop to pass a signal current returning to a ground point and flowing through each signal line in two or more layers connected via a through-hole to each other and a return current of the signal current. This makes it possible to minimize unnecessary emission of electromagnetic waves.

The multilayer printed circuit board provides a third advantage in which for a signal current returning to a ground point and flowing in each signal line, a return current path can be formed without increasing layers of the printed circuit board. There can be formed a small loop including the signal current path and the return current path, which reduces unnecessary emission of electromagnetic waves.

while the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A multilayer printed circuit board, comprising:
   at least two signal wiring layers;
   at least one ground layer;
   at least one power source layer; and
   ground wiring adjacent to signal wiring in at least one signal wiring layer farther apart from said ground layer, the ground wiring being disposed in said signal wiring, said ground wiring serving as a return current path for a signal current flowing in said signal wiring.

2. A multilayer printed circuit board in accordance with claim 1, further including a signal through-hole connecting signal wiring in at least two signal wiring layers to each other.

3. A multilayer printed circuit board in accordance with claim 2, further including:
   a ground plane fabricated in said at least one ground layer; and
   a ground through-hole for connecting said ground plane to said ground wiring.

4. A multilayer printed circuit board in accordance with claim 3, wherein:
   said signal wiring is lower in impedance than said ground plane; and
   the current can be fed back through a shorter closed loop.

5. A multilayer printed circuit board in accordance with claim 2 or 3, wherein said ground through-hole is adjacent to said signal through-hole.

6. A multilayer printed circuit board in accordance with claim 5, wherein:
   said signal wiring is lower in impedance than said ground plane; and
   the current can be fed back through a shorter closed loop.

7. A multilayer printed circuit board in accordance with one of claims 1–3, wherein one or two said ground wiring is fabricated between two said signal wiring,
   said ground wiring being adjacent to said signal wiring in any situation.

8. A multilayer printed circuit board in accordance with claim 7, wherein:
   said signal wiring is lower in impedance than said ground plane; and
   the current can be fed back through a shorter closed loop.

* * * * *